United States Patent
Sato et al.

(10) Patent No.: US 11,976,171 B2
(45) Date of Patent: May 7, 2024

(54) POLYIMIDE RESIN PRECURSOR, POLYIMIDE RESIN, METAL-CLAD LAMINATED BOARD, LAMINATE, AND FLEXIBLE PRINTED WIRING BOARD

(71) Applicant: Arisawa MFG. Co., Ltd., Niigata (JP)

(72) Inventors: Yoshinori Sato, Niigata (JP); Hiroyuki Matsuyama, Niigata (JP); Yoshihiko Konno, Niigata (JP)

(73) Assignee: Arisawa MFG. Co., Ltd., Niigata (JP)

( * ) Notice: Subject to any disclaimer, the term of this patent is extended or adjusted under 35 U.S.C. 154(b) by 0 days.

(21) Appl. No.: 18/031,734

(22) PCT Filed: Oct. 1, 2021

(86) PCT No.: PCT/JP2021/036515
§ 371 (c)(1),
(2) Date: Apr. 13, 2023

(87) PCT Pub. No.: WO2022/085398
PCT Pub. Date: Apr. 28, 2022

(65) Prior Publication Data
US 2023/0312828 A1    Oct. 5, 2023

(30) Foreign Application Priority Data
Oct. 22, 2020  (JP) ................................ 2020-177202

(51) Int. Cl.
*C08G 73/10*     (2006.01)
*H05K 1/03*      (2006.01)

(52) U.S. Cl.
CPC ........... *C08G 73/10* (2013.01); *H05K 1/0346* (2013.01); *H05K 2201/0154* (2013.01)

(58) Field of Classification Search
CPC ...... C08L 79/08; C08J 2379/08; C08G 73/10; C08G 73/1042
See application file for complete search history.

(56) References Cited

FOREIGN PATENT DOCUMENTS

| CN | 20160954820 | * | 3/2017 |
|---|---|---|---|
| JP | H656992 | * | 3/1994 |
| JP | 2005304207 A | | 10/2005 |
| JP | 2012233198 | * | 11/2012 |
| JP | 2012233198 A | | 11/2012 |
| JP | 2018024932 A | | 2/2018 |
| JP | 2018028076 A | | 2/2018 |
| JP | 2018150544 A | | 9/2018 |
| KR | 20190004941 | * | 1/2019 |

OTHER PUBLICATIONS

Written Opinion of the International Searching Authority for International application No. PCT/JP2021/036515, dated Dec. 7, 2021.

* cited by examiner

*Primary Examiner* — Gregory Listvoyb
(74) *Attorney, Agent, or Firm* — Maschoff Brennan; Yuefen Zhou

(57) ABSTRACT

A polyimide resin precursor is obtained by allowing a diamine and an acid anhydride to react with each other. The diamine includes p-phenylenediamine, a bis(aminophenoxy)benzene, and 2-(4-aminophenyl)benzoxazol-5-amine. The acid anhydride includes a biphenyl tetracarboxylic dianhydride. The content of the p-phenylenediamine is 30 to 75% by mol, the content of the bis(aminophenoxy)benzene is 10 to 30% by mol, and the content of the 2-(4-aminophenyl)benzoxazol-5-amine is 10 to 50% by mol, with respect to the total of the diamine. The content of the biphenyl tetracarboxylic dianhydride is 78% by mol or more with respect to the total of the acid anhydride.

8 Claims, No Drawings

POLYIMIDE RESIN PRECURSOR, POLYIMIDE RESIN, METAL-CLAD LAMINATED BOARD, LAMINATE, AND FLEXIBLE PRINTED WIRING BOARD

CROSS REFERENCE TO RELATED APPLICATIONS

This application is a national phase of International Patent Application No. PCT/JP2021/036515, filed Oct. 1, 2021, which claims priority to Japanese Patent Application No. 2020-177202, filed Oct. 22, 2020, all of which are incorporated by reference herein in their entirety.

TECHNICAL FIELD

The present disclosure relates to a polyimide resin precursor, a polyimide resin, a metal-clad laminated board, a laminate, and a flexible printed wiring board.

BACKGROUND ART

Shift from 4G to 5G in the field of mobile communication enables a larger amount of information to be transmitted by radio waves. The higher frequencies of the radio waves are required for the transmission. When electronic instruments receive radio waves of high frequencies, transmission losses are caused in the electronic instruments. For example, various kinds of metal-clad laminated boards and flexible printed wiring boards are proposed as materials for decreasing the transmission losses.

For example, Patent Literature 1 discloses a polyimide resin having a low dielectric constant, a low dielectric dissipation factor, a low linear expansion coefficient, and a low water absorption percentage corresponding to radio waves of high frequencies. Moreover, the literature discloses a metal-clad laminated board and a flexible printed wiring board using the polyimide resin.

CITATION LIST

Patent Literature

Patent Literature 1: Unexamined Japanese Patent Application Publication No. 2018-150544

SUMMARY OF INVENTION

Technical Problem

The transmission loss of an electronic instrument including a metal-clad laminated board and a flexible printed wiring board using such a polyimide resin is low. However, there is scope for improvement that the transmission loss can be further decreased by downsizing recesses and projections (surface roughness) on a rough surface of metal foil used in the metal-clad laminated board. However, a metal-clad laminated board using metal foil of which a surface includes small recesses and projections has a problem that sufficient adhesion between the metal foil and a polyimide resin layer is incapable of being obtained.

The present disclosure was made under such circumstances with an objective to provide: a polyimide resin of which the dielectric constant, dielectric dissipation factor, linear expansion coefficient, and water absorption percentage are low; a metal-clad laminated board and a laminate with high adhesion between the polyimide resin and metal foil; and a flexible printed wiring board with a low transmission loss; and to further provide a polyimide resin precursor constituting the polyimide resin.

Solution to Problem

As a result of intensive examination for solving the problem described above, the presents inventors found that a polyimide resin precursor including a certain diamine and a certain acid anhydride at certain rates and a polyimide resin including the polyimide resin precursor enable the problem described above to be solved, and the present disclosure was thus accomplished.

In other words, the present disclosure is as follows.

[1]

A polyimide resin precursor obtained by allowing a diamine and an acid anhydride to react with each other, wherein the diamine includes p-phenylenediamine, a bis (aminophenoxy)benzene, and 2-(4-aminophenyl)benzoxazol-5-amine; the acid anhydride includes a biphenyl tetracarboxylic dianhydride; a content of the p-phenylenediamine is 30 to 75% by mol, a content of the bis(aminophenoxy)benzene is 10 to 30% by mol, and a content of the 2-(4-aminophenyl)benzoxazol-5-amine is 10 to 50% by mol, with respect to a total of the diamine; and a content of the biphenyl tetracarboxylic dianhydride is 78% by mol or more with respect to a total of the acid anhydride.

[2]

The polyimide resin precursor according to [1], wherein the bis(aminophenoxy)benzene is at least one or more selected from a group consisting of 1,3-bis(4-aminophenoxy)benzene, 1,4-bis(4-aminophenoxy)benzene, and 1,3-bis(3-aminophenoxy) benzene.

[3]

The polyimide resin precursor according to [1] or [2], wherein the acid anhydride includes 0 to 22% by mol of pyromellitic dianhydride with respect to the total of the acid anhydride.

[4]

A polyimide resin formed by curing the polyimide resin precursor according to any one of [1] to [3].

[5]

The polyimide resin according to [4], wherein the polyimide resin has a linear expansion coefficient of 30 ppm/K or less.

[6]

The polyimide resin according to [4] or [5], wherein the polyimide resin has a dielectric constant of 3.50 or less in an ordinary state.

[7]

The polyimide resin according to any one of [4] to [6], wherein the polyimide resin has a dielectric dissipation factor of 0.0040 or less in an ordinary state.

[8]

The polyimide resin according to any one of [4] to [7], wherein the polyimide resin has a water absorption percentage of 1.5% or less.

[9]

A metal-clad laminated board formed by laminating a polyimide resin layer including a polyimide resin on a rough surface or glossy surface of metal foil, wherein the polyimide resin includes the polyimide resin according to any one of [4] to [8], and a surface roughness (Sa) of the rough surface or glossy surface of the metal foil, on which the polyimide resin layer is laminated, is 0.09 to 0.18 μm.

[10]

A laminate formed by laminating the metal-clad laminated boards according to [9] on both surfaces of a laminar thermoplastic polyimide resin, respectively, so that polyimide resin layers included in the metal-clad laminated boards come into contact with the surfaces.

[11]

A flexible printed wiring board including: a substrate on which wiring is formed; and a cover lay film including a base material and an adhesive layer laminated on one surface of the base material, the cover lay film being laminated so that the adhesive layer comes into contact with a surface on which the wiring of the substrate is formed, wherein the substrate includes the metal-clad laminated board according to [9] or the laminate according to [10].

Advantageous Effects of Invention

In accordance with the present disclosure, there can be provided: a polyimide resin of which the dielectric constant, dielectric dissipation factor, linear expansion coefficient, and water absorption percentage are low; a metal-clad laminated board and a laminate with high adhesion between the polyimide resin and metal foil; a flexible printed wiring board with a low transmission loss; and in addition, a polyimide resin precursor constituting the polyimide resin.

DESCRIPTION OF EMBODIMENTS

Embodiments for carrying out the present disclosure (hereinafter simply referred to as "embodiments") are described in detail below. The following embodiments merely exemplify the present disclosure, and are not intended to limit the present disclosure to the following contents. The present disclosure may be appropriately modified and carried out within the scope of the gist of the present disclosure.

(Polyimide Resin Precursor)

A polyimide resin precursor of an embodiment can be cured, and used as a polyimide resin. Moreover, the polyimide resin is preferably used dominantly in a metal-clad laminated board, a laminate, a flexible printed wiring board, and the like. The polyimide resin precursor is also referred to as polyamic acid.

The polyimide resin precursor of the embodiment is a polyimide resin precursor that is obtained by allowing a diamine and an acid anhydride to react with each other. The diamine includes p-phenylenediamine, a bis(aminophenoxy)benzene, and 2-(4-aminophenyl)benzoxazol-5-amine. The acid anhydride includes a biphenyl tetracarboxylic dianhydride.

The content of p-phenylenediamine is 30 to 75% by mol, preferably 50 to 72% by mol, and more preferably 62 to 72% by mol with respect to the total of the components of the diamine. Since the content of p-phenylenediamine is 30 to 75% by mol, the heat resistance of the polyimide resin can be enhanced, and a linear expansion coefficient (hereinafter also referred to as CTE) can be reduced to a low level.

The content of the bis(aminophenoxy)benzene is 10 to 30% by mol, and preferably 10 to 18% by mol with respect to the total of the components of the diamine. Since the content of the bis(aminophenoxy)benzene is 10 to 30% by mol, an adhesion property between the polyimide resin and metal foil can be improved, and a dielectric dissipation factor and the linear expansion coefficient can be reduced to low levels.

The bis(aminophenoxy)benzene preferably includes at least one or more selected from the group consisting of 1,3-bis(4-aminophenoxy)benzene, 1,4-bis(4-aminophenoxy)benzene, and 1,3-bis(3-aminophenoxy)benzene from the viewpoint of improving the adhesion property between the polyimide resin and the metal foil. In addition, 1,3-bis(4-aminophenoxy)benzene is preferred from the viewpoint of reducing the dielectric constant to a low level and of improving an adhesion property between metal foil with very low surface roughness and the polyimide resin.

The content of 2-(4-aminophenyl)benzoxazol-5-amine is 10 to 50% by mol with respect to the total of the components of the diamine. Since the content of 2-(4-aminophenyl)benzoxazol-5-amine is 10 to 50% by mol, the dielectric dissipation factor and the linear expansion coefficient can be reduced to low levels while maintaining the state of the high adhesion between the polyimide resin and the metal foil. The content of 2-(4-aminophenyl)benzoxazol-5-amine is preferably 10 to 30% by mol, and more preferably 10 to 20% by mol.

The diamine may include another component as well as p-phenylenediamine, bis(aminophenoxy)benzene, and 2-(4-aminophenyl)benzoxazol-5-amine. Examples of the other component include m-phenylenediamine, 2,4-diaminotoluene, 4,4'-diaminobiphenyl, 4,4'-diamino-2,2'-bis(trifluoromethyl)biphenyl, 3,3'-diaminodiphenylsulfone, 4,4'-diaminodiphenylsulfone, 4,4'-diaminodiphenylsulfide, 4,4'-diaminodiphenylmethane, 4,4'-diaminodiphenylether, 3,4'-diaminodiphenylether, 3,3'-diaminodiphenylether, 4,4'-bis(4-aminophenoxy)biphenyl, bis[4-(4-aminophenoxy)phenyl]sulfone, bis[4-(3-aminophenoxy)phenyl]sulfone, 2,2-bis[4-(4-aminophenoxy)phenyl]propane, 2,2-bis[4-(4-aminophenoxy)phenyl]hexafluoropropane, 1,3-bis[2-(4-aminophenyl)-2-propyl]benzene, 1,4-bis[2-(4-aminophenyl)-2-propyl]benzene, 2,2'-dimethyl-4,4'-diaminobiphenyl, 2,2'-bis(trifluoromethyl)benzidine, and 2,2-bis(4-aminophenoxyphenyl)propane.

Among the components described above, at least one or more selected from the group consisting of 2,2'-dimethyl-4,4'-diaminobiphenyl, 2,2'-bis(trifluoromethyl)benzidine, 4,4'-diaminodiphenylether, 3,4'-diaminodiphenylether, and 2,2-bis(4-aminophenoxyphenyl)propane are preferably included as the other components from the viewpoint of a price and availability.

At least one or more selected from the group consisting of 2,2'-dimethyl-4,4'-diaminobiphenyl and 2,2'-bis(trifluoromethyl)benzidine are preferably included as the other components from the viewpoint of reducing the linear expansion coefficient of the polyimide resin to a low level.

At least one or more selected from 2,2'-bis(trifluoromethyl)benzidine, 4,4'-diaminodiphenylether, 1,3-bis[2-(4-aminophenyl)-2-propyl]benzene, and 1,4-bis[2-(4-aminophenyl)-2-propyl]benzene are preferably included as the other components from the viewpoint of reducing the dielectric constant of the polyimide resin.

The diamine compounds described above may be used singly, or in combination of two or more kinds thereof.

The acid anhydride includes 78% by mol or more of a biphenyl tetracarboxylic dianhydride with respect to the total of the acid anhydride. As a result, the adhesion property between the polyimide resin and the metal foil can be improved, and the linear expansion coefficient of the polyimide resin can be reduced to 30 ppm/K or less.

The biphenyl tetracarboxylic dianhydride is at least one or more selected from the group consisting of 3,4,3',4'-biphenyl tetracarboxylic dianhydride, 2,3,3',4'-biphenyl tetracarboxylic dianhydride, and 2,3,2',3'-biphenyl tetracarboxylic dianhydride, and especially, 3,4,3',4'-biphenyl tetracarboxylic dianhydride is preferred from the viewpoint of reducing the linear expansion coefficient to a low level.

The acid anhydride may include another component as well as the biphenyl tetracarboxylic dianhydride. Examples of the other component of the acid anhydride include 3,3',4,4'-benzophenone tetracarboxylic dianhydride, 4,4'-oxydiphthalic anhydride, 3,3',4,4'-diphenylsulfone tetracarboxylic dianhydride, pyromellitic dianhydride, and p-phenylene bis(trimellitate anhydride). Among the components described above, pyromellitic dianhydride is preferred from the viewpoint of reducing the linear expansion coefficient of the polyimide resin to a low level. The polyimide resin precursor of the embodiment includes 0 to 22% by mol of pyromellitic dianhydride.

(Method of Producing Polyimide Resin Precursor)

The polyimide resin precursor in the embodiment is obtained by condensation polymerization of the diamine and the acid anhydride by a known method. The procedure of a method of producing the polyimide resin precursor is as follows. First, the diamine is added to a solvent, followed by dissolving the resultant at room temperature. Then, the acid anhydride is slowly added to the resulting solution while stirring the resulting solution. After the addition, the resultant is further stirred at room temperature for 30 minutes or more to obtain the polyimide resin precursor. The temperature at which the stirring is performed is a temperature of from −10° C. to not more than the boiling point of the solvent, preferably room temperature. The solution in which the polyimide resin precursor is dissolved in the solvent is referred to as "polyimide resin precursor solution".

The solvent used in the production of the polyimide resin precursor is not particularly limited as long as being a solvent for dissolving a polyimide resin precursor. Examples of the solvent include aprotic polar solvents, ether-based solvents, water-soluble alcohol-based solvents, water-insoluble alcohol-based solvents, and ketone-based solvents. The solvents described above may be used in mixture of two or more kinds thereof.

Examples of the aprotic polar solvents include N-methylpyrrolidone, N,N-dimethylformamide, N,N-dimethylacetamide, dimethylsulfoxide, and hexamethylphosphoramide.

Examples of the ether-based solvents include 2-methoxyethanol, 2-ethoxyethanol, 2-(methoxy)ethoxyethanol, 2-isopropoxyethanol, 2-butoxyethanol, tetrahydrofurfuryl alcohol, diethylene glycol, diethylene glycol monomethyl ether, diethylene glycol monoethyl ether, diethylene glycol monobutyl ether, triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol, tetrahydrofuran, dioxane, 1,2-dimethoxyethane, diethylene glycol dimethyl ether, and diethylene glycol diethyl ether.

Examples of the water-soluble alcohol-based solvents include methanol, ethanol, 1-propanol, 2-propanol, tert-butyl alcohol, ethylene glycol, 1,2-propanediol, 1,3-propanediol, 1,3-butanediol, 1,4-butanediol, 2,3-butanediol, 1,5-pentanediol, 2-buten-1,4-diol, 2-methyl-2,4-pentanediol, 1,2,6-hexantriol, and diacetone alcohol.

Examples of the water-insoluble alcohol-based solvents include benzyl alcohol.

Examples of the ketone-based solvents include 1,5,5-trimethyl-3-cyclohexanone. In addition, examples of other solvents include γ-butyrolactone.

The rate of the solvent included in the polyimide resin precursor solution is 70 to 90% by mass, and preferably 80 to 90% by mass, in a case in which the total of the polyimide resin precursor solution is set at 100% by mass, from the viewpoint of allowing workability and appearance to be favorable.

The viscosity of the polyimide resin precursor solution is 1 to 50 Pa·s (1000 to 50000 CP), preferably 2 to 30 Pa·s (2000 to 30000 CP), and more preferably 2 to 20 Pa·s (2000 to 20000 CP). The appearance of a coated surface following the coating of the polyimide resin precursor solution on metal foil is allowed to be favorable by setting the viscosity at 1 to 50 Pa·s (1000 to 50000 CP).

(Polyimide Resin)

The polyimide resin of the embodiment is obtained by curing (imidizing) the polyimide resin precursor. Specifically, the polyimide resin precursor is obtained by coating the polyimide resin precursor solution on a base material such as, for example, copper foil, aluminum foil, or a glass plate, and by evaporating the solvent by heating. Then, the polyimide resin is obtained by imidizing the polyimide resin precursor. Temperature for the imidization is 200° C. or more, preferably 250° C. or more, and more preferably 300° C. or more. Time for the heating is 5 minutes or more, and preferably 30 minutes or more.

An apparatus by which the polyimide resin precursor solution is coated on the base material is, for example, a die coater, a comma coater, a gravure coater, a spin coater, a spray coater, or the like.

The polyimide resin of the embodiment can be used as, for example, a resin included in a metal-clad laminated board or a laminate. The polyimide resin of the embodiment, worked in film form, can be used as a polyimide film.

The thickness of the polyimide film is not particularly limited, and is 2 to 125 μm. The polyimide film can be used as, for example, a heat-resistant insulating tape, a cover lay film, a capacitor, or the like.

The linear expansion coefficient of the polyimide resin of the embodiment is 30 ppm/K or less, preferably 28 ppm/K or less, and more preferably 25 ppm/K or less. In the case of 30 ppm/K or less, the linear expansion coefficient of the polyimide resin is low, and therefore, the polyimide resin exhibits the same action as that of metal foil. Accordingly, the metal-clad laminated board, the laminate, and the flexible printed wiring board using such a polyimide resin precludes a change in laminated configuration, caused by a change in temperature change, and the transmission loss of the flexible printed wiring board is low.

The linear expansion coefficient can be measured using an apparatus for thermomechanical analysis TMA. A sample for the measurement is obtained by cutting the film-like polyimide resin having a thickness of 25 Vim into a rectangular shape having a width of 5 mm and a length of 15 mm. The measurement is performed by, for example, measuring a change in dimension in a range of 100 to 200° C. at a temperature-raising rate of 10° C./min.

The dielectric constant (relative permittivity) of the polyimide resin of the embodiment in the ordinary state is 3.50 or less, preferably 3.40 or less, and more preferably 3.30 or less. The transmission loss of the flexible printed wiring board becomes low by setting the dielectric constant in the ordinary state at 3.50 or less. The ordinary state refers to a state in which the sample for the measurement is left to stand for 24 hours or more under atmosphere at 23° C. and 50% RH. Hereinafter, the same applies to embodiments.

The dielectric constant of the polyimide resin of the embodiment after water absorption is 3.60 or less, preferably 3.50 or less, and more preferably 3.40 or less. A dielectric constant of 3.60 or less after water absorption can result in a decreased transmission loss without depending on an environment in which an electronic instrument is used. The state after the water absorption refers to a state just after wiping off water adhering to a surface of the sample for the measurement following immersion of the sample for the measurement in pure water at 23° C. for 24 hours. Hereinafter, the same applies to embodiments.

The dielectric constant can be measured by a split post dielectric resonator method (SPDR method). A sample for the measurement is a sample obtained by cutting the film-like polyimide resin into a predetermined size. The condition of the measurement is, for example, a frequency of 10 GHz under atmosphere at 23° C.

The dielectric dissipation factor of the polyimide resin of the embodiment in an ordinary state is 0.0040 or less, and preferably 0.0035 or less. The transmission loss of the flexible printed wiring board can be reduced by setting the dielectric dissipation factor in the ordinary state at 0.0040 or less.

The dielectric dissipation factor of the polyimide resin of the embodiment after water absorption is 0.0080 or less, preferably 0.0070 or less, and more preferably 0.0060 or less. A dielectric dissipation factor of 0.0080 or less after water absorption can result in a decrease in the transmission loss of the flexible printed wiring board without depending on an environment in which an electronic instrument is used.

The dielectric dissipation factor can be measure by a method similar to the method of measuring the dielectric constant.

The water absorption percentage of the polyimide resin of the embodiment is 1.5% or less, preferably 1.2% or less, and more preferably 1.0% or less. A water absorption percentage of 1.5% or less can result in a decrease in the transmission loss of the flexible printed wiring board. The reason that the low water absorption percentage is preferred is because the dielectric constant and the dielectric dissipation factor of water are very high.

The water absorption percentage can be determined based on a change between masses before and after immersion in pure water. A sample for the measurement is a film-like polyimide resin, cut into a predetermined size. The sample for the measurement before the immersion is a sample left to stand for 30 minutes under atmosphere at 105° C. The sample for the measurement after the immersion is a sample just after wiping off water adhering to a surface of the sample for the measurement following immersion of the sample in pure water at 23° C. for 24 hours.

(Metal-Clad Laminated Board)

In the metal-clad laminated board of the embodiment, a polyimide resin layer including the polyimide resin of the embodiment is laminated on a rough surface or glossy surface of the metal foil. The surface roughness (Sa) of the rough surface or glossy surface of the metal foil, on which the polyimide resin layer is laminated, is 0.09 to 0.18 μm. The rough surface or glossy surface of the metal foil, on which the polyimide resin layer is laminated, is also referred to as "laminate surface" or "coated surface". The laminate surface or the coated surface may be subjected to antirust treatment, or surface treatment with a silane coupling agent and/or the like. The metal-clad laminated board is also referred to as "single-sided metal-clad laminated board".

Examples of the metal foil include copper foil, aluminum foil, and SUS foil. Copper foil is preferred from the viewpoint of conductivity and circuit workability on metal foil. Examples of the kinds of the metal foil include electrolytic metal foil and rolled metal foil, of which either can be used. In the case of the metal-clad laminated board used for bending, the metal foil is preferably rolled metal foil. The thickness of the metal foil is not particularly limited, and is 2 to 35 μm.

The surface roughness (Sa) is an arithmetic mean height, and can be determined in conformity with ISO 25178. The surface roughness of the metal foil of the embodiment (the roughness of the surface of the metal foil, on which the polyimide resin is laminated) is 0.09 to 0.18 μm, and preferably 0.09 to 0.13 μm, from the viewpoint of decreasing a transmission loss.

The thickness of the laminated polyimide resin layer is not particularly limited, and 2 to 100 μm.

The adhesion between the metal foil and the polyimide resin layer in the metal-clad laminated board of the embodiment is 6 N/cm or more, preferably 8 N/cm or more, and more preferably 10 N/cm or more. In the metal-clad laminated board of the embodiment, having such high adhesion, interlayer peeling hardly occurs in an interface between the metal foil and the polyimide resin layer that are brought into intimate contact with each other. As a result, an electronic instrument including the metal-clad laminated board of the embodiment has high reliability in long-term use.

The adhesion can be evaluated by measuring peeling strength (peel strength). The production of the sample and the measurement of the peeling strength are performed according to JIS C6471.8.1. The peeling strength (peel strength) can be determined by measuring strength at which the metal foil of the sample is tensed in a direction of 900 (direction perpendicular to a surface of the copper layer of the metal-clad laminated board). The condition of the measurement is a tension speed of 50 mm/min.

(Method of Producing Metal-Clad Laminated Board)

A method of producing a metal-clad laminated board of an embodiment includes the steps of: coating a polyimide resin precursor solution on a rough surface of metal foil; drying the polyimide resin precursor solution coated on the metal foil; and imidizing a polyimide resin precursor to form a polyimide resin.

In the step of coating the polyimide resin precursor solution on the rough surface of the metal foil, the thickness of the coated polyimide resin precursor solution formed on the metal foil is set in a range of 2 to 150 μm as appropriate. Examples of coating apparatuses include a comma coater, a die coater, and a gravure coater. In the method of producing the metal-clad laminated board of the embodiment, the polyimide resin precursor solution is coated on the rough surface of the metal foil. However, the polyimide resin precursor solution may be coated on the glossy surface of the metal foil depending on an application, or may be coated on both the surfaces of the metal foil.

In the step of drying the polyimide resin precursor solution coated on the metal foil, temperature is set in a range of 80 to 200° C. as appropriate. Time for drying is adjusted depending on the temperature as appropriate. The amount of a residual solvent included in the dried polyimide resin precursor is preferably 50% by mass or less with respect to 100% by mass of the resin component of the polyimide resin precursor. As a result, stickiness on the surface of the polyimide resin precursor layer formed on the rough surface of the metal foil becomes absent (tackiness is reduced), and therefore, a copper-clad laminated board can be wound in roll-to-roll process. Moreover, the polyimide resin precursor spreads over every hole and corner of the surface of the metal foil in the interface between the metal foil and the polyimide resin precursor layer, and therefore, the adhesion property between the polyimide resin and the metal foil, following the imidization of the polyimide resin precursor, is improved.

In the step of imidizing the polyimide resin precursor to form the polyimide resin, temperature is set in a range of 300 to 400° C. as appropriate. Time for imidizing the polyimide resin precursor is adjusted depending on temperature as appropriate.

(Laminate)

In a laminate of an embodiment, metal-clad laminated boards are laminated on both the surfaces of a laminar thermoplastic polyimide resin, respectively, so that the polyimide resin layers included in the metal-clad laminated board of the embodiment come into contact with both the surfaces of the laminar thermoplastic polyimide resin. The laminate is also referred to as "double-sided metal-clad laminated board".

The thermoplastic polyimide resin of the embodiment is a resin that is softened when the thermoplastic polyimide resin is heated to not less than glass transition temperature (Tg), and has an elastic modulus considerably decreased at not less than Tg. The elastic modulus of the thermoplastic polyimide resin can be measured by dynamic viscoelastic measurement (DMA). In the measurement of the thermoplastic polyimide resin by DMA, the elastic modulus (E) is slowly decreased with an increase in temperature, and extremely decreased at around Tg.

The thermoplastic polyimide resin can be obtained by imidizing a thermoplastic polyimide resin precursor obtained by allowing a diamine of which examples include 2,2-bis(4-(4-aminophenoxy)phenyl)propane and a dianhydride of which examples include 3,4,3',4'-biphenyl tetracarboxylic dianhydride to react with each other. Examples of commercially available thermoplastic polyimide resins include Midfil (trade name) manufactured by Kurabo Industries, Ltd., PIAD (trade name) manufactured by ARAKAWA CHEMICAL INDUSTRIES, LTD., and AURUM (trade name) manufactured by Mitsui Chemicals, Inc. The thermoplastic polyimide resin can be used in varnish or sheet form. For example, in a case in which the thermoplastic polyimide resin in the varnish form is coated on metal foil, a thickness after drying is 3 to 16 μm. In the case of the sheet form, a thickness is 2 to 8 μm.

(Method of Producing Laminate)

A method of producing a laminate of an embodiment includes the steps of: coating a thermoplastic polyimide resin precursor solution on polyimide resin layers included in single-sided metal-clad laminated boards and drying the thermoplastic polyimide resin precursor solution; imidizing a thermoplastic polyimide resin precursor to form thermoplastic polyimide resin layers; laminating the two single-sided metal-clad laminated boards, on which the thermoplastic polyimide resin layers are formed, so that the thermoplastic polyimide resin layers come into contact with each other; and thermocompression-bonding a laminate in which the two single-sided metal-clad laminated boards are laminated.

In the step of coating the thermoplastic polyimide resin precursor solution on the polyimide resin layers included in the single-sided metal-clad laminated boards and drying the thermoplastic polyimide resin precursor solution, the thermoplastic polyimide resin precursor coated on the polyimide resin layers has a thickness of 3 to 16 μm after the drying. A coating apparatus can be selected depending on the thickness of the coating as appropriate. Examples of the coating apparatus include a comma coater, a die coater, and a gravure coater. Temperature in the drying is set in a range of 80 to 200° C. as appropriate. Time is adjusted depending on the set temperature as appropriate.

In the step of imidizing the thermoplastic polyimide resin precursor to form the thermoplastic polyimide resin layers, temperature in the imidization is set in a range of 300 to 400° C. as appropriate. Time is adjusted depending on the temperature as appropriate.

In the step of laminating the two single-sided metal-clad laminated boards, on which the thermoplastic polyimide resin layers are formed, so that the thermoplastic polyimide resin layers come into contact with each other, pressurization is acceptable in the lamination.

In the step of thermocompression-bonding a laminate in which the two single-sided metal-clad laminated boards are laminated, the thermocompression bonding is performed by hot press or roll lamination. Heating temperature is set, as appropriate, in a range of not less than the Tg of thermoplastic polyimide and not more than 380° C. Pressure is set in a range of 0.5 to 5 MPa as appropriate. Time is set in a range of 5 sec to 120 min as appropriate.

Another method of producing a laminate includes the steps of: laminating a sheet-like thermoplastic polyimide resin on a polyimide resin layer included in a single-sided metal-clad laminated board; laminating another single-sided metal-clad laminated board so that a polyimide resin layer included in the other single-sided metal-clad laminated board and the sheet-like thermoplastic polyimide resin come into contact with each other; and thermocompression-bonding a laminated laminate.

(Flexible Printed Wiring Board)

A flexible printed wiring board of an embodiment includes: a substrate on which wiring is formed; and a cover lay film including a base material and an adhesive layer laminated on one surface of the base material. The cover lay film is laminated so that the adhesive layer comes into contact with a surface on which the wiring of the substrate is formed. The substrate includes the metal-clad laminated board of the embodiment or the laminate of the embodiment.

The wiring formed on the substrate is, for example, wiring formed by etching treatment of the copper layer of a copper-clad laminated board. Instead of copper, another metal such as SUS, aluminum, or zinc may be included.

The thickness of the substrate used in the flexible printed wiring board of the embodiment is 15 to 200 μm from the viewpoint of allowing the substrate to have flexibility.

(Method of Producing Flexible Printed Wiring Board)

A method of producing a flexible printed wiring board of an embodiment includes: preparing a substrate in which wiring is formed on a metal layer portion included in a metal-clad laminated board, and a cover lay film; laminating a cover lay film on a surface, on which the wiring is formed, of the substrate so that an adhesive layer comes into contact with the surface; and thermocompression-bonding a laminate in which the cover lay film is laminated on the substrate.

In the step of thermocompression-bonding the laminate, temperature in the thermocompression-bonding is set in a range of 120 to 250° C. as appropriate. Pressure is set in a range of 1 to 10 MPa as appropriate. Time is set in a range of 5 sec to 120 min as appropriate.

EXAMPLES

The present disclosure is described in more detail below with reference to Examples and Comparative Examples below. However, the present disclosure is not limited to Examples below.

The following diamines, acid anhydrides, solvents, and copper foils are used as diamines, acid anhydrides, solvents, and copper foils used in Examples and Comparative Examples.

(Diamine)
p-PDA: p-phenylenediamine
TPE-R: 1,3-bis(4-aminophenoxy)benzene
TPE-Q: 1,4-bis(4-aminophenoxy)benzene
APB: 1,3-bis(3-aminophenoxy)benzene
5ABO: 2-(4-aminophenyl)benzoxazol-5-amine
ODA: 4,4'-diaminodiphenylether
m-TB: 2,2'-dimethyl-4,4'-diaminobiphenyl
BAPP: 2,2-bis[4-(4-aminophenoxy)phenyl]propane
(Acid Anhydride)
s-BPDA: 3,4,3',4'-biphenyl tetracarboxylic dianhydride
PMDA: pyromellitic dianhydride
TAHQ: p-phenylene bis(trimellitate anhydride)
(Solvent)
DMAc: N,N-dimethylacetamide
NMP: N-methylpyrrolidone
(Copper Foil)
Copper foil A: surface roughness (Sa) of rough surface of the copper foil: 0.13 μm, maximum height (Rz): 0.8 μm, manufactured by JX Nippon Mining & Metals Corporation, BHM-treated rolled copper foil: 12 μm
Copper foil B: surface roughness (Sa) of glossy surface of copper foil: 0.18 μm, maximum height (Rz): 0.8 μm, manufactured by FUKUDA METAL FOIL & POWDER CO., LTD., FLEQ HD electrolytic copper foil: 12 μm
Copper foil C: surface roughness (Sa) of rough surface of copper foil: 0.09 μm, maximum height (Rz): 0.6 μm, manufactured by JX Nippon Mining & Metals Corporation, GHY5-treated rolled copper foil: 12 μm
Copper foil D: surface roughness (Sa) of rough surface of copper foil: 0.30 μm, maximum height (Rz): 1.2 μm, manufactured by Furukawa Electric Co., Ltd., F2-WS electrolytic copper foil: 12 μm In Examples and Comparative Examples, each evaluation method and each measurement method were performed by the following methods.

<Surface Roughness (Sa)> and <Maximum Height (Rz)>
The surface roughness (Sa) and maximum height (Rz) of the rough surface or glossy surface of the copper foil were measured.

(1) Sample for Measurement
The copper foil used was cut into a square, 100 mm each side, regarded as a sample for measurement.

(2) Measurement Method
The surface roughness (Sa), that is, arithmetic mean height of the sample prepared in (1) was measured in conformity with ISO 25178. CONTOUR GT-K manufactured by Bruker was used as a measurement apparatus. The maximum height (Rz) was measured together with the measurement of Sa.

<Adhesion>
Peeling strength (peel strength) was measured and evaluated as adhesion.

(1) Sample for Measurement
A predetermined pattern was etched on each of the surfaces of the copper layers included in the copper-clad laminated boards obtained in Examples and Comparative Examples, and the copper-clad laminated boards, left to stand for 24 hours or more under atmosphere at 23° C. and 50% RH, were regarded as samples for measurement. The predetermined pattern is a pattern in which a plurality of rectangles having a length of 200 mm and a width of 3 mm is arranged in a direction orthogonal to the direction of the length of each rectangle.

(2) Measurement Method
Each sample for measurement, produced in (1), was measured in conformity with Section 8.1 in JIS C 6471. Autograph AGS-500 manufactured by SHIMADZU CORPORATION was used as a measurement instrument. For the measurement, peel strength in a direction of 900 (direction perpendicular to a surface of the copper layer of the copper-clad laminated board) was measured. The condition of the measurement was set at a test speed of 50 mm/min, and the measurement was performed by a method in which one end of a lead copper layer (copper foil) was grasped and pulled off (pulling of copper foil).

(3) Evaluation Criteria
Evaluation criteria were as follows.
Excellent: peel strength of 10 N/cm or more
Good: peel strength of 6.0 N/cm or more and less than 10.0 N/cm
Poor: peel strength of less than 6.0 N/cm <Linear Expansion Coefficient (CTE)>
For a linear expansion coefficient, a dimensional change with changing temperature was measured and evaluated.

(1) Measurement Samples
All of the copper layers (copper foils) included in the copper-clad laminated boards obtained in Examples 1 to 13 and Comparative Examples 1 to 21 were removed by etching, left to stand for 24 hours or more under atmosphere at 23° C. and 50% RH, and then cut into rectangles each having a length of 15 mm and a width of 5 mm, regarded as samples for measurement (samples in ordinary state).

(2) Measurement Method
A linear expansion coefficient in a temperature range of 100 to 200° C. was calculated from measurement data for a dimensional change from 100 to 200° C. using an apparatus for thermomechanical analysis TMA-60, manufactured by SHIMADZU CORPORATION. Measurement conditions were set at a load of 5 g and a temperature-raising rate of 10° C./min.

(3) Evaluation Criteria
Evaluation criteria were as follows.
Excellent: 25 ppm/K or less
Good: 26 ppm/K or more and 30 ppm/K or less
Poor: 31 ppm/K or more <Dielectric Constant, Dielectric Dissipation Factor>
A dielectric constant and a dielectric dissipation factor were measured and evaluated by a split post dielectric resonator method (SPDR method).

(1) Measurement Samples
(1-1) Samples in Ordinary State
All of the copper layers (copper foils) included in the copper-clad laminated boards obtained in Examples 1 to 13 and Comparative Examples 1 to 21 were removed by etching, left to stand for 24 hours or more under atmosphere at 23° C. and 50% RH, and regarded as samples in an ordinary state. A sample shape was set at a square, 100 mm each side.

(1-2) Samples after Water Absorption
Samples, just after wiping off excess water on surfaces of the samples following removal of all of the copper layers (copper foils) included in the copper-clad laminated boards obtained in Examples 1 to 13 and Comparative Examples 1 to 21 by etching, and immersion of the samples in pure water at 23° C. for 24 hours, were regarded as samples after water absorption. A sample shape was set at a square, 100 mm each side.

(2) Measurement Method

The measurement samples produced in (1) is mounted to a dedicated jig (SPDR fixture), and measured using Network Analyzer N5230A manufactured by Agilent Technologies. Measurement conditions were set at a frequency of 10 GHz under atmosphere at 23° C. The measurement was performed at n=5, and the average values thereof were regarded as the dielectric constants and the dielectric dissipation factors of the measurement samples.

(3) Evaluation Criteria (3-1) Evaluation Criteria of Dielectric Constant and Dielectric Dissipation Factor in Ordinary State The evaluation criteria of a dielectric constant in an ordinary state were as follows.

Excellent: 3.30 or less
Good: 3.31 or more and 3.50 or less
Poor: 3.51 or more

The evaluation criteria of a dielectric dissipation factor in an ordinary state were as follows.

Excellent: 0.0035 or less
Good: 0.0036 or more and 0.0040 or less
Poor: 0.0041 or more (3-2) Evaluation Criteria of Dielectric Constant and Dielectric Dissipation Factor after Water Absorption The evaluation criteria of a dielectric constant after water absorption were as follows.

Excellent: 3.40 or less
Good: 3.41 or more and 3.60 or less
Poor: 3.61 or more

The evaluation criteria of a dielectric dissipation factor after water absorption were as follows.

Excellent: 0.0060 or less
Good: 0.0061 or more and 0.0080 or less
Poor: 0.0081 or more <Water Absorption Percentage>

For a water absorption percentage, a change between masses before and after immersion of each sample in pure water was measured and evaluated.

(1) Measurement Samples

All of the copper layers (copper foils) included in the copper-clad laminated boards obtained in Examples 1 to 13 and Comparative Examples 1 to 21 were removed by etching, and cut into squares, 50 mm each side. The samples left to stand for 30 minutes under atmosphere at 105° C. and cooled to room temperature were regarded as measurement samples before the immersion. The samples, just after wiping off water adhering to surfaces of the measurement samples following the immersion of the samples in pure water at 23° C. for 24 hours, were regarded as measurement samples after the immersion.

(2) Measurement Method

The mass of each measurement sample before the immersion was measured, and regarded as m0. The mass of each measurement sample after the immersion was measured, and regarded as md. The measured values were substituted into Equation: $((md-m0)\times 100)/m0$=water absorption percentage (%), and the water absorption percentage was measured. The measurement was performed at n=3, and the average value thereof was regarded as the water absorption percentage of each measurement sample.

(3) Evaluation Criteria

The evaluation criteria of the water absorption percentage were as follows.

Excellent: 1.0% or less
Good: 1.1% or more and 1.5% or less
Poor: 1.6% or more

<Transmission Loss>

Each dedicated sample for measuring a transmission loss was produced, and a transmission loss (attenuation of signal) was measured by a microstrip line method using the sample.

(1) Measurement Samples

A linear circuit having a length of 100 mm and a width of 91 μm was formed, by etching, on a copper layer (copper foil) on one surface, included in each of the double-sided copper-clad laminated boards obtained in Examples 14 to 16 and Comparative Example 22. A copper layer (copper foil) on the other surface was maintained in an unchanged state without etching. Here, the linear circuit is also referred to as "microstrip line".

The width of the microstrip line is determined by setting an impedance at 50Ω, and substituting the thickness of the microstrip line (thickness of copper foil), and the thickness and dielectric constant of an insulation layer included in the double-sided copper-clad laminated board into the design calculation equation of the microstrip line. Here, the insulation layer of each of the double-sided copper-clad laminated boards obtained in Examples 14 to 16 and Comparative Example 22 refers to a layer in which a polyimide resin layer, a thermoplastic polyimide resin layer, a thermoplastic polyimide resin layer, and a polyimide resin layer are laminated in the order mentioned above.

(2) Measurement Apparatus

In the measurement, an apparatus including Fixture 3680V, manufactured by ANRITSU CORPORATION, for measuring the transmission gain of a sample, and Network Analyzer N5247A, manufactured by Agilent Technologies, for analyzing the measured data to measure a transmission loss was used as a measurement apparatus.

(3) Measurement Method

Each sample produced in (1) was mounted to a dedicated jig attached to Fixture 3680V manufactured by ANRITSU CORPORATION. Then, a transmission loss was measured at a measurement frequency of 20 GHz.

(4) Evaluation Criteria

The evaluation criteria of the transmission loss were as follows.

Good: −5 dB/10 cm or more
Poor: less than −5 dB/10 cm

In Example 1, a single-sided copper-clad laminated board for measuring adhesion and the like was produced.

Example 1

Into a flask of 500 mL, 85 g of NMP, 2.2844 g of p-PDA (62% by mol with respect to 100% by mol of diamine), 1.5349 g of 5ABO (20% by mol with respect to 100% by mol of diamine), and 1.7929 g of TPE-R (18% by mol with respect to 100% by mol of diamine) were added, and the mixture was stirred at room temperature until the mixture was dissolved. To the obtained solution, 7.7643 g of s-BPDA (78% by mol with respect to 100% by mol of acid anhydride) and 1.6235 g of PMDA (22% by mol with respect to 100% by mol of acid anhydride) were slowly added. Then, the resultant was stirred at room temperature for 6 hours, to thereby obtain a polyimide resin precursor solution.

The obtained polyimide resin precursor solution was coated on a rough surface of copper foil A using a bar coater so that the thickness of an imidized resin was 25 μm, and dried under atmosphere at 130° C. for 15 minutes, to obtain the copper foil A on which a polyimide resin precursor layer was formed.

The copper foil A was cooled to room temperature, and the temperature of the copper foil A was then raised to 360° C. (foil temperature) at a temperature-raising rate of 35° C./min, and the copper foil A was kept at 360° C. for 3 minutes. Then, the copper foil A was naturally cooled to room temperature, to obtain the single-sided copper-clad laminated board.

(Example 2) to (Example 13), and (Comparative Example 1) to (Comparative Example 21)

Single-sided copper-clad laminated boards were produced by methods similar to the method of Example 1 except that the kind and content of each component, and the kind of copper foil were changed, as set forth in Tables 1A to 3B. The single-sided copper-clad laminated board of Example 4 was produced to have a configuration in which a polyimide resin layer was formed on a glossy surface of copper foil B.

TABLE 1A

|  |  | Example 1 | Example 2 | Example 3 | Example 4 | Example 5 | Example 6 | Example 7 |
|---|---|---|---|---|---|---|---|---|
| Diamine (mol %) | p-PDA | 62 | 62 | 62 | 62 | 62 | 72 | 52 |
|  | TPE-R | 18 | 0 | 0 | 18 | 18 | 18 | 18 |
|  | TPE-Q | 0 | 18 | 0 | 0 | 0 | 0 | 0 |
|  | APB | 0 | 0 | 18 | 0 | 0 | 0 | 0 |
|  | 5ABO | 20 | 20 | 20 | 20 | 20 | 10 | 30 |
|  | ODA | 0 | 0 | 0 | 0 | 0 | 0 | 0 |
|  | m-TB | 0 | 0 | 0 | 0 | 0 | 0 | 0 |
| Acid anhydride (mol %) | s-BPDA | 78 | 78 | 78 | 78 | 78 | 78 | 78 |
|  | PMDA | 22 | 22 | 22 | 22 | 22 | 22 | 22 |
|  | TAHQ | 0 | 0 | 0 | 0 | 0 | 0 | 0 |
| Thickness of polyimide (μm) |  | 25 | 25 | 25 | 25 | 25 | 25 | 25 |
| Surface of copper foil (μm) | Sa | 0.13 | 0.13 | 0.13 | 0.18 | 0.09 | 0.13 | 0.13 |
|  | Rz | 0.8 | 0.8 | 0.8 | 0.8 | 0.6 | 0.8 | 0.8 |
|  | Kind of copper foil | A | A | A | B | C | A | A |
| Adhesion (N/cm) Pulling of Cu at 90° | Ordinary state | 8.0 | 6.5 | 8.4 | 14.3 | 10.8 | 7.7 | 8.0 |
|  | Evaluation | Good | Good | Good | Excellent | Excellent | Good | Good |
| Dielectric constant (10 GHz) | Ordinary state | 3.37 | 3.29 | 3.34 | 3.35 | 3.37 | 3.29 | 3.41 |
|  | Evaluation | Good | Excellent | Good | Good | Good | Excellent | Good |
|  | After water absorption | 3.43 | 3.35 | 3.42 | 3.43 | 3.50 | 3.39 | 3.56 |
|  | Evaluation | Good | Excellent | Good | Good | Good | Excellent | Good |
| Dielectric dissipation factor (10 GHZ) | Ordinary state | 0.0033 | 0.0039 | 0.0030 | 0.0034 | 0.0036 | 0.0038 | 0.0039 |
|  | Evaluation | Excellent | Good | Excellent | Excellent | Good | Good | Good |
|  | After water absorption | 0.0067 | 0.0080 | 0.0066 | 0.0068 | 0.0068 | 0.0074 | 0.0061 |
|  | Evaluation | Good | Good | Good | Good | Good | Good | Good |
| Water absorption percentage (%) | D-24/23 | 1.2 | 1.0 | 1.0 | 1.1 | 1.2 | 1.2 | 0.8 |
|  | Evaluation | Good | Excellent | Excellent | Good | Good | Good | Excellent |
| CTE (ppm/K) | Ordinary state | 24 | 23 | 27 | 24 | 24 | 20 | 22 |
|  | Evaluation | Excellent | Excellent | Good | Excellent | Excellent | Excellent | Excellent |

TABLE 1B

|  |  | Example 8 | Example 9 | Example 10 | Example 11 | Example 12 | Example 13 |
|---|---|---|---|---|---|---|---|
| Diamine (mol %) | p-PDA | 32 | 70 | 62 | 50 | 50 | 65 |
|  | TPE-R | 18 | 10 | 18 | 30 | 30 | 12 |
|  | TPE-Q | 0 | 0 | 0 | 0 | 0 | 0 |
|  | APB | 0 | 0 | 0 | 0 | 0 | 0 |
|  | 5ABO | 50 | 20 | 20 | 20 | 20 | 23 |
|  | ODA | 0 | 0 | 0 | 0 | 0 | 0 |
|  | m-TB | 0 | 0 | 0 | 0 | 0 | 0 |
| Acid anhydride (mol %) | s-BPDA | 78 | 78 | 100 | 100 | 78 | 78 |
|  | PMDA | 22 | 22 | 0 | 0 | 22 | 15 |
|  | TAHQ | 0 | 0 | 0 | 0 | 0 | 7 |
| Thickness of polyimide (μm) |  | 25 | 25 | 25 | 25 | 25 | 25 |
| Surface of copper foil (μm) | Sa | 0.13 | 0.13 | 0.13 | 0.13 | 0.13 | 0.13 |
|  | Rz | 0.8 | 0.8 | 0.8 | 0.8 | 0.8 | 0.8 |
|  | Kind of copper foil | A | A | A | A | A | A |
| Adhesion (N/cm) Pulling of Cu at 90° | Ordinary state | 7.5 | 7.5 | 7.7 | 7.7 | 8.3 | 6.3 |
|  | Evaluation | Good | Good | Good | Good | Good | Good |
| Dielectric constant (10 GHz) | Ordinary state | 3.36 | 3.34 | 3.35 | 3.35 | 3.35 | 3.36 |
|  | Evaluation | Good | Good | Good | Good | Good | Good |
|  | After water absorption | 3.51 | 3.45 | 3.51 | 3.40 | 3.45 | 3.34 |
|  | Evaluation | Good | Good | Good | Excellent | Good | Excellent |
| Dielectric dissipation factor (10 GHz) | Ordinary state | 0.0037 | 0.0038 | 0.0036 | 0.0035 | 0.0038 | 0.0031 |
|  | Evaluation | Good | Good | Good | Excellent | Good | Excellent |
|  | After water absorption | 0.0065 | 0.0078 | 0.0074 | 0.0059 | 0.0067 | 0.0057 |
|  | Evaluation | Good | Good | Good | Excellent | Good | Excellent |

TABLE 1B-continued

|  |  | Example 8 | Example 9 | Example 10 | Example 11 | Example 12 | Example 13 |
|---|---|---|---|---|---|---|---|
| Water absorption percentage (%) | D-24/23 | 0.9 | 1.2 | 1.0 | 0.6 | 1.0 | 0.9 |
|  | Evaluation | Excellent | Good | Excellent | Excellent | Excellent | Excellent |
| CTE (ppm/K) | Ordinary state | 29 | 25 | 26 | 26 | 28 | 29 |
|  | Evaluation | Good | Excellent | Good | Good | Good | Good |

TABLE 2A

|  |  | Comparative Example 1 | Comparative Example 2 | Comparative Example 3 | Comparative Example 4 | Comparative Example 5 | Comparative Example 6 |
|---|---|---|---|---|---|---|---|
| Diamine (mol %) | p-PDA | 76 | 62 | 62 | 62 | 40 | 40 |
|  | TPE-R | 14 | 18 | 18 | 18 | 40 | 40 |
|  | TPE-Q | 0 | 0 | 0 | 0 | 0 | 0 |
|  | APB | 0 | 0 | 0 | 0 | 0 | 0 |
|  | 5ABO | 10 | 20 | 20 | 20 | 20 | 20 |
|  | ODA | 0 | 0 | 0 | 0 | 0 | 0 |
|  | m-TB | 0 | 0 | 0 | 0 | 0 | 0 |
| Acid anhydride (mol %) | s-BPDA | 65 | 50 | 25 | 0 | 78 | 50 |
|  | PMDA | 0 | 50 | 75 | 100 | 22 | 50 |
|  | TAHQ | 35 | 0 | 0 0 | 0 | 0 | 0 |
| Thickness of polyimide (μm) |  | 25 | 25 | 25 | 25 | 25 | 25 |
| Surface of copper foil (μm) | Sa | 0.13 | 0.13 | 0.13 | 0.13 | 0.13 | 0.13 |
|  | Rz | 0.8 | 0.8 | 0.8 | 0.8 | 0.8 | 0.8 |
|  | Kind of copper foil | A | A | A | A | A | A |
| Adhesion (N/cm) Pulling of Cu at 90° | Ordinary state | 3.0 | 2.8 | 1.7 | Unmeasurable | 9.0 | 6.0 |
|  | Evaluation | Poor | Poor | Poor | — | Good | Good |
| Dielectric constant (10 GHZ) | Ordinary state | 3.35 | 3.39 | 3.68 | Unmeasurable | 3.12 | 3.32 |
|  | Evaluation | Good | Good | Poor | — | Excellent | Good |
|  | After water absorption | 3.49 | 3.52 | 3.75 | Unmeasurable | 3.23 | 3.47 |
|  | Evaluation | Good | Good | Poor | — | Excellent | Good |
| Dielectric dissipation factor (10 GHz) | Ordinary state | 0.0030 | 0.0086 | 0.0176 | Unmeasurable | 0.0032 | 0.0062 |
|  | Evaluation | Excellent | Poor | Poor | — | Excellent | Poor |
|  | After water absorption | 0.0054 | 0.0160 | 0.0274 | Unmeasurable | 0.0055 | 0.0100 |
|  | Evaluation | Excellent | Poor | Poor | — | Excellent | Poor |
| Water absorption percentage (%) | D-24/23 | 0.8 | 1.6 | 1.8 | Unmeasurable | 0.6 | 1.4 |
|  | Evaluation | Excellent | Poor | Poor | — | Excellent | Good |
| CTE (ppm/K) | Ordinary state | 28 | 48 | 19 | Unmeasurable | 35 | 53 |
|  | Evaluation | Good | Poor | Excellent | — | Poor | Poor |

TABLE 2B

|  |  | Comparative Example 7 | Comparative Example 8 | Comparative Example 9 | Comparative Example 10 | Comparative Example 11 |
|---|---|---|---|---|---|---|
| Diamine (mol %) | p-PDA | 20 | 0 | 0 | 70 | 80 |
|  | TPE-R | 60 | 80 | 80 | 0 | 0 |
|  | TPE-Q | 0 | 0 | 0 | 0 | 0 |
|  | APB | 0 | 0 | 0 | 0 | 0 |
|  | 5ABO | 20 | 20 | 20 | 30 | 20 |
|  | ODA | 0 | 0 | 0 | 0 | 0 |
|  | m-TB | 0 | 0 | 0 | 0 | 0 |
| Acid anhydride (mol %) | s-BPDA | 78 | 78 | 100 | 100 | 100 |
|  | PMDA | 22 | 22 | 0 | 0 | 0 |
|  | TAHQ | 0 | 0 | 0 | 0 | 0 |
| Thickness of polyimide (μm) |  | 25 | 25 | 25 | 25 | 25 |
| Surface of copper foil (μm) | Sa | 0.13 | 0.13 | 0.13 | 0.13 | 0.13 |
|  | Rz | 0.8 | 0.8 | 0.8 | 0.8 | 0.8 |
|  | Kind of copper foil | A | A | A | A | A |

TABLE 2B-continued

| | | Comparative Example 7 | Comparative Example 8 | Comparative Example 9 | Comparative Example 10 | Comparative Example 11 |
|---|---|---|---|---|---|---|
| Adhesion (N/cm) Pulling of Cu at 90° | Ordinary state | 6.2 | 8.7 | 11.7 | 4.3 | 4.5 |
| | Evaluation | Good | Good | Excellent | Poor | Poor |
| Dielectric constant (10 GHz) | Ordinary state | 3.45 | 3.18 | 3.26 | 3.89 | 3.58 |
| | Evaluation | Good | Excellent | Excellent | Poor | Poor |
| | After water absorption | 3.51 | 3.34 | 3.32 | 4.14 | 3.92 |
| | Evaluation | Good | Excellent | Excellent | Poor | Poor |
| Dielectric dissipation factor (10 GHZ) | Ordinary state | 0.0043 | 0.003 | 0.0034 | 0.0986 | 0.0676 |
| | Evaluation | Poor | Excellent | Excellent | Poor | Poor |
| | After water absorption | 0.0082 | 0.0054 | 0.0065 | 0.1280 | 0.0936 |
| | Evaluation | Poor | Excellent | Good | Poor | Poor |
| Water absorption percentage (%) | D-24/23 | 1.3 | 0.6 | 0.9 | 4.5 | 4.3 |
| | Evaluation | Good | Excellent | Excellent | Poor | Poor |
| CTE (ppm/K) | Ordinary state | 34 | 50 | 36 | 19 | 18 |
| | Evaluation | Poor | Poor | Poor | Excellent | Excellent |

TABLE 3A

| | | Comparative Example 12 | Comparative Example 13 | Comparative Example 14 | Comparative Example 15 | Comparative Example 16 |
|---|---|---|---|---|---|---|
| Diamine (mol %) | p-PDA | 85 | 0 | 0 | 80 | 20 |
| | TPE-R | 0 | 0 | 0 | 10 | 30 |
| | TPE-Q | 0 | 0 | 0 | 0 | 0 |
| | APB | 0 | 0 | 0 | 0 | 0 |
| | 5ABO | 15 | 100 | 100 | 10 | 50 |
| | ODA | 0 | 0 | 0 | 0 | 0 |
| | m-TB | 0 | 0 | 0 | 0 | 0 |
| Acid anhydride (mol %) | s-BPDA | 78 | 78 | 100 | 78 | 78 |
| | PMDA | 22 | 22 | 0 | 22 | 22 |
| | TAHQ | 0 | 0 | 0 | 0 | 0 |
| Thickness of polyimide (µm) | | 25 | 25 | 25 | 25 | 25 |
| Surface of copper foil (µm) | Sa | 0.13 | 0.13 | 0.13 | 0.13 | 0.13 |
| | Rz | 0.8 | 0.8 | 0.8 | 0.8 | 0.8 |
| | Kind of copper foil | A | A | A | A | A |
| Adhesion (N/cm) Pulling of Cu at 90° | Ordinary state | Unmeasurable | Unmeasurable | 4.0 | 6.4 | 8.5 |
| | Evaluation | — | — | Poor | Good | Good |
| Dielectric constant (10 GHZ) | Ordinary state | Unmeasurable | Unmeasurable | 3.66 | 3.40 | 3.36 |
| | Evaluation | — | — | Poor | Good | Good |
| | After water absorption | Unmeasurable | Unmeasurable | 3.61 | 3.44 | 3.55 |
| | Evaluation | — | — | Poor | Good | Good |
| Dielectric dissipation factor (10 GHz) | Ordinary state | Unmeasurable | Unmeasurable | 0.0418 | 0.0044 | 0.0038 |
| | Evaluation | — | — | Poor | Poor | Good |
| | After water absorption | Unmeasurable | Unmeasurable | 0.0517 | 0.0078 | 0.0068 |
| | Evaluation | — | — | Poor | Good | Good |
| Water absorption percentage (%) | D-24/23 | Unmeasurable | Unmeasurable | 3.6 | 1.2 | 1.1 |
| | Evaluation | — | — | Poor | Good | Good |
| CTE (ppm/K) | Ordinary state | Unmeasurable | Unmeasurable | 62 | 27 | 35 |
| | Evaluation | — | — | Poor | Good | Poor |

TABLE 3B

| | | Comparative Example 17 | Comparative Example 18 | Comparative Example 19 | Comparative Example 20 | Comparative Example 21 |
|---|---|---|---|---|---|---|
| Diamine (mol %) | p-PDA | 30 | 70 | 82 | 72 | 0 |
| | TPE-R | 10 | 30 | 18 | 28 | 0 |
| | TPE-Q | 0 | 0 | 0 | 0 | 0 |
| | APB | 0 | 0 | 0 | 0 | 0 |
| | 5ABO | 60 | 0 | 0 | 0 | 20 |
| | ODA | 0 | 0 | 0 | 0 | 25 |
| | m-TB | 0 | 0 | 0 | 0 | 55 |

TABLE 3B-continued

| | | Comparative Example 17 | Comparative Example 18 | Comparative Example 19 | Comparative Example 20 | Comparative Example 21 |
|---|---|---|---|---|---|---|
| Acid anhydride (mol %) | s-BPDA | 78 | 100 | 78 | 78 | 0 |
| | PMDA | 22 | 0 | 22 | 22 | 0 |
| | TAHQ | 0 | 0 | 10 | 0 | 100 |
| Thickness of polyimide (μm) | | 25 | 25 | 25 | 25 | 25 |
| Surface of copper foil (μm) | Sa | 0.13 | 0.13 | 0.13 | 0.13 | 0.13 |
| | Rz | 0.8 | 0.8 | 0.8 | 0.8 | 0.8 |
| | Kind of copper foil | A | A | A | A | A |
| Adhesion (N/cm) Pulling of Cu at 90° | Ordinary state Evaluation | Unmeasurable — | 9.0 Good | 7.2 Good | 7.8 Good | 2.0 Poor |
| Dielectric constant (10 GHZ) | Ordinary state Evaluation | Unmeasurable — | 3.35 Good | 3.36 Good | 3.22 Excellent | 3.04 Excellent |
| | After water absorption Evaluation | Unmeasurable — | 3.44 Good | 3.48 Good | 3.29 Excellent | 3.10 Excellent |
| Dielectric dissipation factor (10 GHz) | Ordinary state Evaluation | Unmeasurable — | 0.0044 Poor | 0.0047 Poor | 0.0043 Poor | 0.0025 Excellent |
| | After water absorption Evaluation | Unmeasurable — | 0.0083 Poor | 0.0076 Good | 0.0073 Good | 0.0040 Excellent |
| Water absorption percentage (%) | D-24/23 Evaluation | Unmeasurable — | 1.2 Good | 1.1 Good | 1.0 Excellent | 0.3 Excellent |
| CTE (ppm/K) | Ordinary state Evaluation | Unmeasurable — | 38 Poor | 23 Excellent | 29 Good | 24 Excellent |

In Example 14, a double-sided copper-clad laminated board for measuring a transmission loss was produced.

Example 14

(Production of Thermoplastic Polyimide Resin Precursor Solution)

Into a flask of 500 mL, 87 g of DMAc and 7.6044 g (0.01852 mol) of BAPP were added, and the mixture was stirred at room temperature until the mixture was dissolved. To the obtained solution, 5.3956 g (0.01834 mol) of s-BPDA was slowly added. Then, the resultant was stirred at room temperature for 3 hours, to thereby obtain a thermoplastic polyimide resin precursor solution.

(Production of Single-Sided Copper-Clad Laminated Board with Thermoplastic Polyimide Resin)

The polyimide resin precursor solution obtained in Example 1 was coated on a rough surface of copper foil A using a bar coater so that the thickness of an imidized resin was 23 μm, and dried under atmosphere at 130° C. for 15 minutes, to obtain the copper foil A on which a polyimide resin precursor layer was formed. Then, the thermoplastic polyimide resin precursor solution produced in advance was coated on the coated surface so that the thickness of the dried resin was 2 μm, and dried for 5 minutes under atmosphere at 130° C. After the drying, the copper foil A in which the polyimide resin precursor layer and the thermoplastic polyimide resin precursor layer were laminated in the order mentioned above, closer to the copper foil, was obtained.

The copper foil A was cooled to room temperature, and the temperature of the copper foil A was then raised to 360° C. (foil temperature) at a temperature-raising rate of 35° C./min, and the copper foil A was kept at 360° C. for 3 minutes. Then, the copper foil A was naturally cooled to room temperature, to obtain the single-sided copper-clad laminated board with the thermoplastic polyimide resin layer.

(Production of Double-Sided Copper-Clad Laminated Board)

The obtained two single-sided copper-clad laminated boards were prepared, and laminated in a state in which the thermoplastic polyimide resin layers of the single-sided copper-clad laminated boards came into contact with each other. The laminate was pressed under conditions of at 320° C., 4 MPa, and 10 minutes, to thereby obtain a double-sided copper-clad laminated board. The configuration of the double-sided copper-clad laminated board of Example 14 was a configuration in which the copper foil (12 μm), the polyimide resin layer (23 μm), the thermoplastic polyimide resin layer (2 μm), the thermoplastic polyimide resin layer (2 μm), the polyimide resin layer (23 μm), and the copper foil (12 μm) were laminated in the order mentioned above.

(Example 15), (Example 16), and (Comparative Example 22)

Double-sided copper-clad laminated boards were produced by similar methods using the same materials as those in Example 14 except that the kind of copper foil was changed, as set forth in Table 4. The single-sided copper-clad laminated board used in Example 15 was produced to have a configuration in which a polyimide resin layer was formed on a glossy surface of copper foil B.

TABLE 4

| | | Example 14 | Example 15 | Example 16 | Comparative Example 22 |
|---|---|---|---|---|---|
| Diamine (mol %) | p-PDA | 62 | 62 | 62 | 62 |
| | TPE-R | 18 | 18 | 18 | 18 |
| | TPE-Q | 0 | 0 | 0 | 0 |
| | APB | 0 | 0 | 0 | 0 |
| | 5ABO | 20 | 20 | 20 | 20 |

TABLE 4-continued

|  |  | Example 14 | Example 15 | Example 16 | Comparative Example 22 |
|---|---|---|---|---|---|
| Acid anhydride (mol %) | ODA | 0 | 0 | 0 | 0 |
|  | m-TB | 0 | 0 | 0 | 0 |
|  | s-BPDA | 78 | 78 | 78 | 78 |
|  | PMDA | 22 | 22 | 22 | 22 |
|  | TAHQ | 0 | 0 | 0 | 0 |
| Thickness of insulation layer (*) (μm) |  | 50 | 50 | 50 | 50 |
| Dielectric constant of insulation layer (*) | Ordinary state | 3.34 | 3.34 | 3.34 | 3.34 |
| Surface of copper foil (μm) | Sa | 0.13 | 0.18 | 0.09 | 0.30 |
|  | Rz | 0.8 | 0.8 | 0.6 | 1.2 |
|  | Kind of copper foil | A | B | C | D |
| Adhesion (N/cm) Pulling of Cu at 90° | Ordinary state | 7.7 | 13.5 | 10.3 | 9.2 |
|  | Evaluation | Good | Excellent | Excellent | Good |
| Transmission loss (dB/10 cm) 20 GHz | Ordinary state | −4.1 | −4.0 | −4.5 | −5.6 |
|  | Evaluation | Good | Good | Good | Poor |

"Insulation layer (*)" in Table 4 means a layer collectively including four layers of a polyimide resin layer, a thermoplastic polyimide resin layer, a thermoplastic polyimide resin layer, and a polyimide resin layer.

As set forth in Tables 1A and 1B, the copper-clad laminated boards of Examples 1 to 13 were excellent in adhesion property between the polyimide resin layer and metal foil, and also excellent in dielectric constant, dielectric dissipation factor, linear expansion coefficient, and water absorption percentage. The transmission loss of an electronic instrument using a flexible printed wiring board and a laminate including such laminated boards is low.

As evidence therefor, it was found that each of the copper-clad laminated boards of Examples 14 to 16 was excellent in adhesion property between the polyimide resin layer and the metal foil although the surface roughness of the copper foil was low, and was also excellent in transmission loss, as set forth in Table 4.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2020-177202, filed on Oct. 22, 2020, the entire disclosure of which is incorporated by reference herein.

The invention claimed is:

1. A polyimide resin precursor to be obtained by allowing a diamine and an acid anhydride to react with each other, wherein the diamine comprises p-phenylenediamine, a bis(aminophenoxy)benzene, and 2-(4-aminophenyl)benzoxazol-5-amine, the acid anhydride comprises a biphenyl tetracarboxylic dianhydride, a content of the p-phenylenediamine is 30 to 75% by mol, a content of the bis(aminophenoxy)benzene is 10 to 30% by mol, and a content of the 2-(4-aminophenyl)benzoxazol-5-amine is 10 to 50% by mol, with respect to a total of the diamine, and a content of the biphenyl tetracarboxylic dianhydride is 78% by mol or more with respect to a total of the acid anhydride.

2. The polyimide resin precursor according to claim 1, wherein the bis(aminophenoxy)benzene is at least one or more selected from a group consisting of 1,3-bis(4-aminophenoxy)benzene, 1,4-bis(4-aminophenoxy)benzene, and 1,3-bis(3-aminophenoxy) benzene.

3. The polyimide resin precursor according to claim 1, wherein the acid anhydride comprises 0 to 22% by mol of pyromellitic dianhydride with respect to the total of the acid anhydride.

4. A polyimide resin to be formed by curing the polyimide resin precursor according to claim 1.

5. The polyimide resin according to claim 4, wherein the polyimide resin has a linear expansion coefficient of 30 ppm/K or less.

6. The polyimide resin according to claim 4, wherein the polyimide resin has a dielectric constant of 3.50 or less in an ordinary state.

7. The polyimide resin according to claim 4, wherein the polyimide resin has a dielectric dissipation factor of 0.0040 or less in an ordinary state.

8. The polyimide resin according to claim 4, wherein the polyimide resin has a water absorption percentage of 1.5% or less.

* * * * *